United States Patent
Brill et al.

(10) Patent No.: US 8,113,767 B2
(45) Date of Patent: Feb. 14, 2012

(54) AUXILIARY POWER UNIT INLET DUCT WITH ACOUSTIC SILENCING

(75) Inventors: Jeffrey Carl Brill, Poway, CA (US); James C. Napier, San Diego, CA (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 757 days.

(21) Appl. No.: 12/210,462

(22) Filed: Sep. 15, 2008

(65) Prior Publication Data
US 2010/0068036 A1 Mar. 18, 2010

(51) Int. Cl.
*F04D 29/66* (2006.01)

(52) U.S. Cl. .......................................... 415/119; 244/58

(58) Field of Classification Search ................. 244/53 B, 244/58; 415/119
See application file for complete search history.

(56) References Cited

U.S. PATENT DOCUMENTS

| 5,140,819 A | 8/1992 | Napier |
| 6,247,668 B1 | 6/2001 | Reysa |
| 6,509,081 B1 * | 1/2003 | Diamond ...................... 428/131 |
| 6,536,207 B1 | 3/2003 | Kamen |
| 7,344,107 B2 * | 3/2008 | Campbell et al. ............... 244/58 |
| 7,364,117 B2 | 4/2008 | Dionne |

* cited by examiner

*Primary Examiner* — Quoc Hoang
(74) *Attorney, Agent, or Firm* — Carlson, Gaskey & Olds, PC

(57) ABSTRACT

An inlet duct for an auxiliary power unit comprises an inlet end, and extends to an outlet end. At least one splitter is positioned within the duct and between the inlet and the outlet end to sub-divide an interior of the duct into plural flow paths.

14 Claims, 2 Drawing Sheets

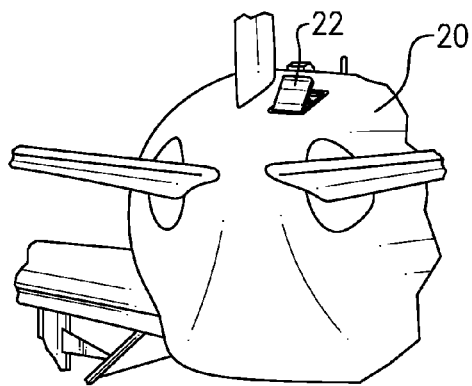
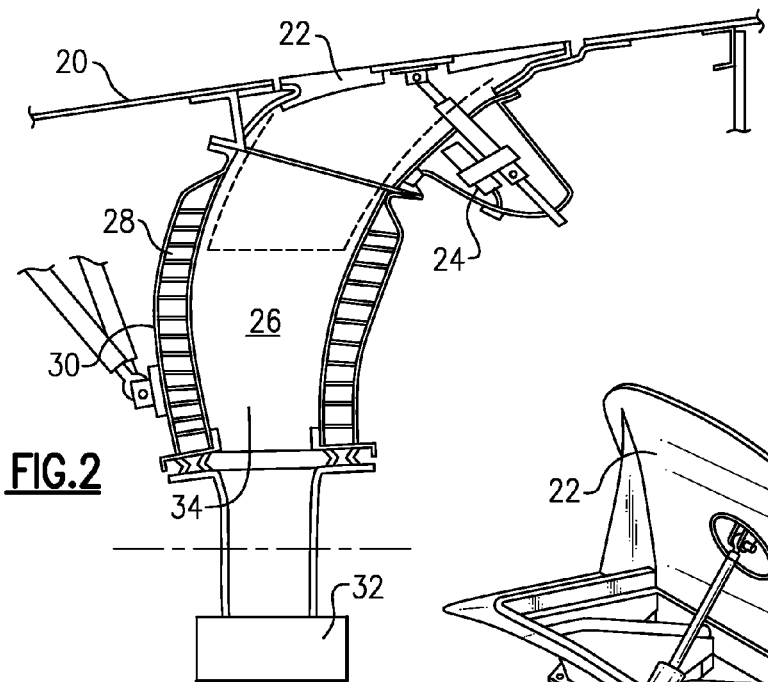
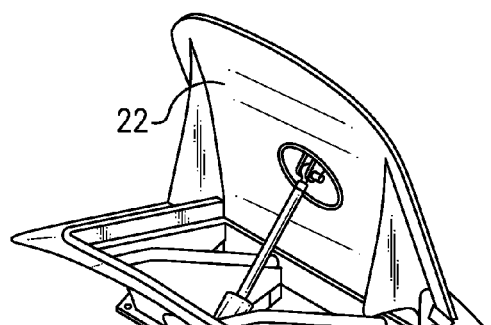
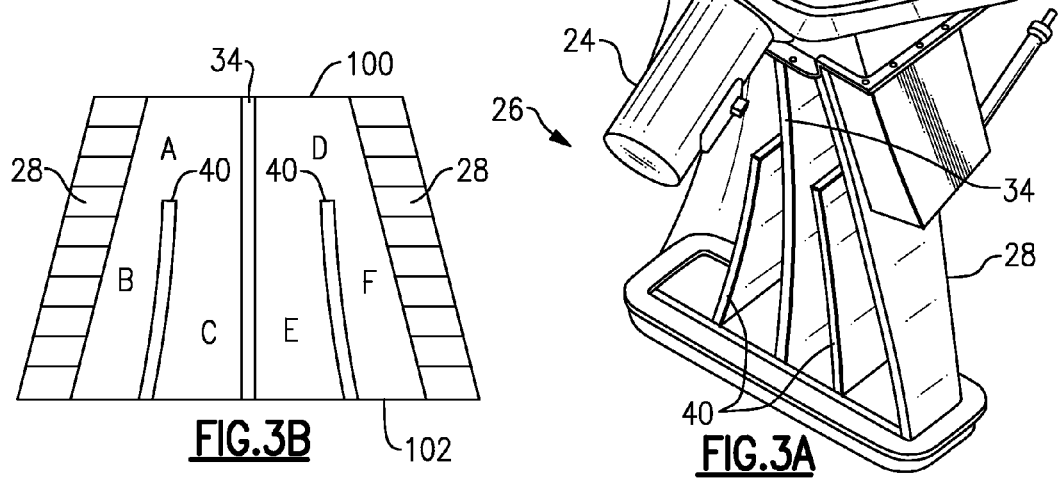

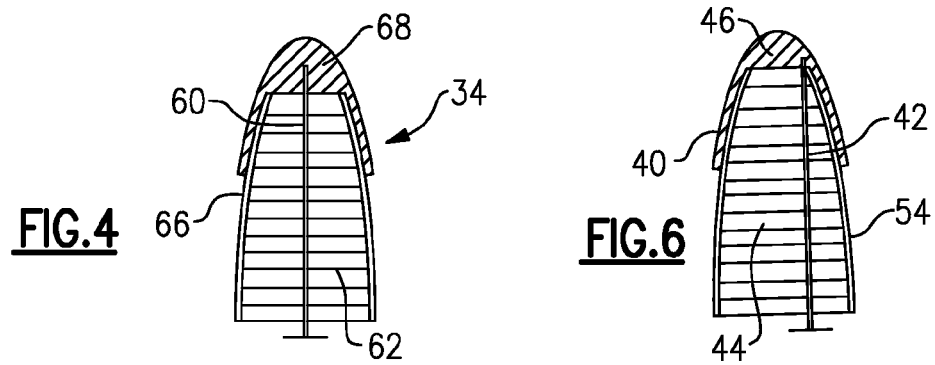
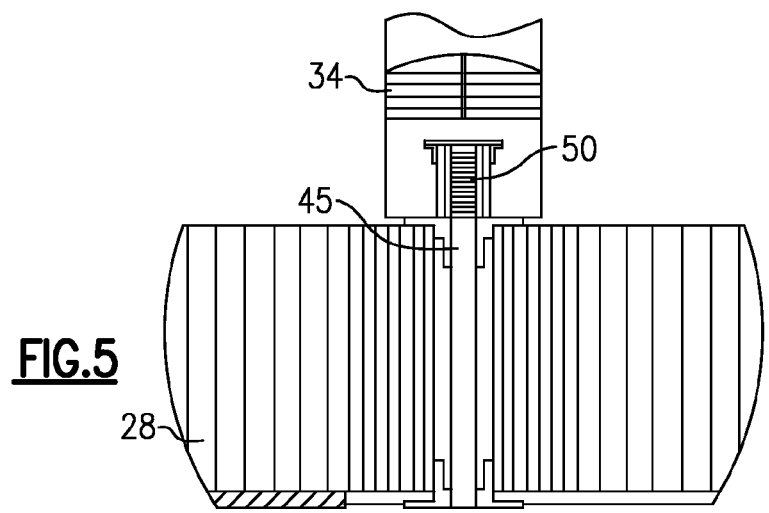
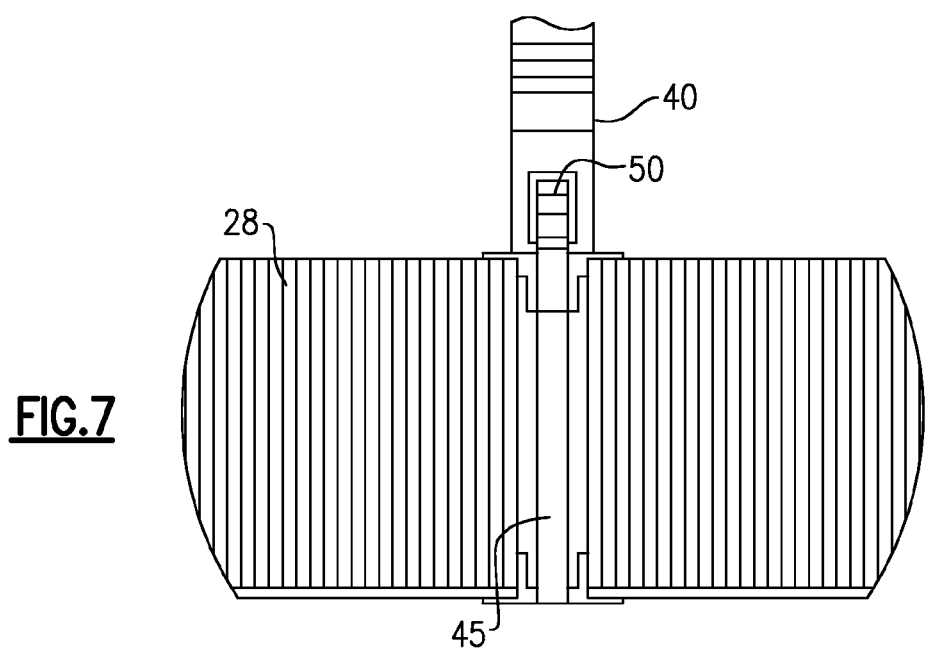

US 8,113,767 B2

AUXILIARY POWER UNIT INLET DUCT WITH ACOUSTIC SILENCING

BACKGROUND OF THE INVENTION

This application relates to an inlet duct for an auxiliary power unit on an airplane.

Auxiliary power units are utilized in aircraft to supply power when the aircraft is not in flight, and in some conditions, during flight. An auxiliary power unit is often provided by a relatively small gas turbine engine, typically located in the tail cone of the aircraft.

When the vent door is open, high levels of noise from the gas turbine engine, and in particular its compression section, are emitted from the inlet duct. This is a particular concern when the aircraft is on the ground with the auxiliary power unit operating.

SUMMARY OF THE INVENTION

An inlet duct for an auxiliary power unit comprises an inlet end, and extends from the inlet end to an outlet end. At least one splitter is positioned within the duct and between the inlet and the outlet ends to sub-divide the inlet duct interior into multiple flow paths.

These and other features of the present invention can be best understood from the following specification and drawings, the following of which is a brief description.

BRIEF DESCRIPTION OF THE DRAWINGS

FIG. 1 shows the location of an auxiliary power unit inlet duct on an aircraft.

FIG. 2 is a cross-sectional view through an auxiliary power unit air duct.

FIG. 3A is a perspective view showing features of the present invention.

FIG. 3B is a cross-section through an air duct.

FIG. 4 is a cross-sectional view through a portion of the FIG. 3 assembly.

FIG. 5 is a cross-sectional view showing the attachment of a splitter to a housing.

FIG. 6 is a cross-sectional view through another portion of the FIG. 3 assembly.

FIG. 7 is yet another cross-sectional view showing the attachment of another splitter to the overall housing.

DETAILED DESCRIPTION OF THE PREFERRED EMBODIMENT

FIG. 1 shows an aircraft 20 having an auxiliary power unit inlet door 22 in its tail cone. As known, when an auxiliary power unit is operating, it will require air. On the other hand, when the auxiliary power unit is not in operation, the inlet door 22 is preferably closed to minimize drag on the overall aircraft 20.

FIG. 2 shows the door 22 having an actuation mechanism 24, and leading into an inlet duct 26. Inlet duct 26 feeds air to an auxiliary power unit 32, shown schematically. As known, the auxiliary power unit 32 includes a gas turbine engine, as described above.

Honeycomb acoustic material 28 is positioned on interior surfaces of the inlet duct, and inside of a metal housing 30. Splitters 34 and 40 (see FIGS. 3A and 3B) are illustrated in FIG. 2 and divide the flow of the air into several sub-paths, to reduce operational noise. Not only do the splitters 34 and 40 reduce operational noise, but they provide structural stiffening to strengthen the duct walls. The duct walls are subject to pressure extremes, and these splitters, which as shown below connect the side walls, provide stiffening to resist these pressure extremes. In addition, the splitters straighten the inlet flow to provide a low inlet flow distortion leading into a compressor for the downstream gas turbine engine.

As can be better seen in FIG. 3A, the duct 26 has splitters 40 and 34 that sub-divide the airflow into four distinct paths. As can be seen in FIG. 3B, a first splitter 34 splits airflow into paths A and D, while side splitters 40 split path A into paths B and C, and path D into paths E and F. The size of the several paths, and the relationship of the splitters relative to each other, can be designed to reduce particular operational noise. As one example, noise from the compressor in the auxiliary power unit may be the largest source of noise that a designer would wish to reduce. In that case, the splitters should be designed to specifically address that particular noise. A worker of ordinary skill would recognize how to so design the splitters accordingly.

As shown in FIGS. 3A and 3B, the first splitter 34 extends the entire length of the inlet duct 26, while the side splitters 40 extend for a shorter distance. As can be appreciated, in particular from FIG. 3B, the air inlet duct 26 is defined by an overall body having an inlet end 100 and an outlet end 102. The first splitter 34 may extend entirely from the inlet end 100 to the outlet end 102, while the side splitters only extend over a portion of this distance and are spaced from inlet end 100. As can be appreciated from FIGS. 2 and 3B, the air downstream of outlet end 102 intermixes and communicates with the auxiliary power unit 32.

The splitters 34 and 40 as shown in FIGS. 3A and 3B are somewhat schematically, and as generally rectangular parts. In fact, the splitters may have a shape as shown better in FIGS. 4-7. FIGS. 4 and 5 show the attachment of the first splitter 34 at its sides, with the sides being generally facing out of, and into, the plane of FIG. 3B. FIG. 5 shows one of those two sides attached to the honeycomb material 28. Similarly, FIGS. 6 and 7 show the splitters 40.

FIG. 4 shows a cross-sectional view through the central splitter 34. A metal septum 60 has honeycomb material 62 on opposed sides, and an outer acoustic layer, which may be felt metal 66. An end cap 68 is attached to the upper end of the splitter 34.

FIG. 5 shows how the first splitter 34 is attached at its sides to the honeycomb material 28. As shown, a screw thread 50 is formed extending upwardly into each side of the first splitter 34, and a bolt 45 is driven through threads in the honeycomb material 28, and into the screw threads 50 to secure the splitter 34.

FIG. 6 shows the side splitter 40 having similar structure with the central septum 42, honeycomb material 44, outer acoustic liner 54 of felt metal, and an end cap 46.

The splitters 40 are also attached at their ends with bolts 45 extending into threads 50 in the side of the splitters 40.

The splitters are shown in one orientation in FIGS. 3A and 3B, however, they could be at other orientations relative to each other, and at other relative lengths, etc.

Although an embodiment of this invention has been disclosed, a worker of ordinary skill in this art would recognize that certain modifications would come within the scope of this invention. For that reason, the following claims should be studied to determine the true scope and content of this invention.

What is claimed is:

1. An inlet duct for an auxiliary power unit comprising:
an inlet door to be pivotable between open and closed positions, and at an upstream end of an inlet duct body;

said inlet duct body extending from an inlet end to an outlet end;

a plurality of splitters positioned within said inlet duct body and between said inlet and said outlet ends to sub-divide an interior of said inlet duct body into plural flow paths; and said plurality of splitters including acoustic deadening material.

2. The inlet duct as set forth in claim 1, wherein a first splitter extends for an entire distance between said inlet end and said outlet end.

3. The inlet duct as set forth in claim 2, wherein said first splitter includes a metal septum surrounded by said acoustic deadening material.

4. The inlet duct as set forth in claim 3, wherein said surrounding acoustic deadening material includes splitter honeycomb material.

5. The inlet duct as set forth in claim 4, wherein said first splitter further includes an outer felt metal layer.

6. The inlet duct as set forth in claim 1, wherein said inlet duct body includes honeycomb material, and said splitters are secured to said honeycomb material at least one side of said inlet duct body.

7. An inlet duct for an auxiliary power unit comprising:

an inlet door to be pivotable between open and closed positions, and at an upstream end of an inlet duct body;

said inlet duct body extending from an inlet end to an outlet end;

a plurality of splitters positioned within said inlet duct body and between said inlet and said outlet ends to sub-divide an interior of said inlet duct body into plural flow paths;

a first splitter extends for an entire distance between said inlet end and said outlet end; and side splitters are arranged between said first splitter and a side wall of said inlet duct on each side of said first splitter to further sub-divide the flow paths, and wherein said side splitters do not extend to said inlet end, but do extend to said outlet end.

8. An auxiliary power unit comprising:

a gas turbine engine;

an air duct for supplying air to said gas turbine engine, the air duct including a body extending from an inlet end to an outlet end, and a plurality of splitters positioned within said body and between said inlet and said outlet ends to sub-divide an interior of said body into plural flow paths, and an inlet door to be pivotable between open and closed positions and control the flow of air into the air duct; and the air downstream of said air duct communicating to an inlet for said gas turbine engine.

9. The auxiliary power unit as set forth in claim 8, wherein a first splitter extends for an entire distance between said inlet end and said outlet end.

10. The auxiliary power unit as set forth in claim 9, wherein side splitters are arranged between said first splitter and a side wall of said body on each side of said first splitter to further sub-divide the flow paths, wherein said side splitters do not extend to said inlet end, but do extend to said outlet end.

11. The auxiliary power unit as set forth in claim 9, wherein said first splitter includes a metal septum surrounded by acoustic deadening material.

12. The auxiliary power unit as set forth in claim 11, wherein said surrounding acoustic deadening material includes splitter honeycomb material.

13. The auxiliary power unit as set forth in claim 12, wherein said first splitter further includes an outer felt metal layer.

14. The auxiliary power unit as set forth in claim 8, wherein said body includes honeycomb material, and said splitters are secured to said honeycomb material at least one side of said body.

* * * * *